(12) United States Patent
Turner et al.

(10) Patent No.: US 8,564,375 B2
(45) Date of Patent: Oct. 22, 2013

(54) METHODS AND APPARATUS FOR SELF-TRIM CALIBRATION OF AN OSCILLATOR

(75) Inventors: John R. Turner, Portland, ME (US); Tyler Daigle, Portland, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 116 days.

(21) Appl. No.: 13/341,490

(22) Filed: Dec. 30, 2011

(65) Prior Publication Data

US 2013/0169369 A1    Jul. 4, 2013

(51) Int. Cl.
 *H03L 7/24* (2006.01)
(52) U.S. Cl.
 USPC ............... 331/47; 331/1 A; 331/2; 331/46; 331/48; 331/50; 375/354; 375/360
(58) Field of Classification Search
 USPC ............. 331/1 A, 2, 46–50; 375/354, 360
 See application file for complete search history.

(56) References Cited

U.S. PATENT DOCUMENTS

| | | | | |
|---|---|---|---|---|
| 5,459,435 A | * | 10/1995 | Taki | 331/1 A |
| 6,127,895 A | * | 10/2000 | Tailor | 331/1 A |
| 6,329,860 B1 | * | 12/2001 | Komatsu | 327/291 |
| 6,404,246 B1 | | 6/2002 | Estakhari et al. | |
| 6,606,003 B2 | * | 8/2003 | Conroy | 331/1 A |
| 6,671,221 B2 | | 12/2003 | Beer et al. | |
| 2004/0066845 A1 | * | 4/2004 | Leith et al. | 375/238 |
| 2007/0019770 A1 | * | 1/2007 | Bradley et al. | 375/360 |
| 2009/0066434 A1 | * | 3/2009 | Isberg | 331/183 |

* cited by examiner

*Primary Examiner* — Joseph Chang
*Assistant Examiner* — Jeffrey Shin
(74) *Attorney, Agent, or Firm* — Brake Hughes Bellermann LLP

(57) ABSTRACT

In one general aspect, an apparatus can include a reference oscillator counter circuit configured to produce a reference oscillator count value based on a reference oscillator signal, and a target oscillator counter circuit configured to produce a target oscillator count value based on a target oscillator signal where the target oscillator signal has a frequency targeted for calibration against a frequency of the reference oscillator signal. The apparatus can include a difference circuit configured to calculate a difference between the reference oscillator counter value and the target oscillator counter value, and a summation circuit configured to define a trim code based on only a portion of bit values from the difference.

20 Claims, 5 Drawing Sheets

METHODS AND APPARATUS FOR
SELF-TRIM CALIBRATION OF AN
OSCILLATOR

TECHNICAL FIELD

This description relates to methods and apparatus for oscillator calibration.

BACKGROUND

Known oscillators manufactured using semiconductor processing techniques can have a frequency output that is a function of resistors and capacitors in a resistor-capacitor (RC) network. Semiconductor processing variations can cause relatively wide variations in frequency output of the oscillators. Because the frequencies of oscillators can vary, the oscillators can include circuitry that can be used to calibrate the frequencies of the oscillators to a reference frequency. This process can be referred to as trimming the oscillator. In some instances, trimming of an oscillator can be implemented through digital bits used to couple different resistor and/or capacitor networks to oscillator to change the frequency of the oscillator.

Calibration or trimming of a frequency of an oscillator can be performed using various known methods including iteratively measuring the frequency of the target oscillator output directly and converting the measurement into a correction factor, comparing counter values related, respectively, to the frequency of the target oscillator and a frequency of a reference oscillator, and so forth. Using known oscillator calibration techniques can be relatively inefficient, can consume relatively significant test time, for example, at wafer sort or final test, can occupy significant portions of device die area when implemented in hardware, and/or so forth. Thus, a need exists for systems, methods, and apparatus to address the shortfalls of present technology and to provide other new and innovative features.

SUMMARY

In one general aspect, an apparatus can include a reference oscillator counter circuit configured to produce a reference oscillator count value based on a reference oscillator signal, and a target oscillator counter circuit configured to produce a target oscillator count value based on a target oscillator signal where the target oscillator signal has a frequency targeted for calibration against a frequency of the reference oscillator signal. The apparatus can include a difference circuit configured to calculate a difference between the reference oscillator counter value and the target oscillator counter value, and a summation circuit configured to define a trim code based on only a portion of bit values from the difference.

The details of one or more implementations are set forth in the accompanying drawings and the description below. Other features will be apparent from the description and drawings, and from the claims.

DETAILED DESCRIPTION

Figure 1:
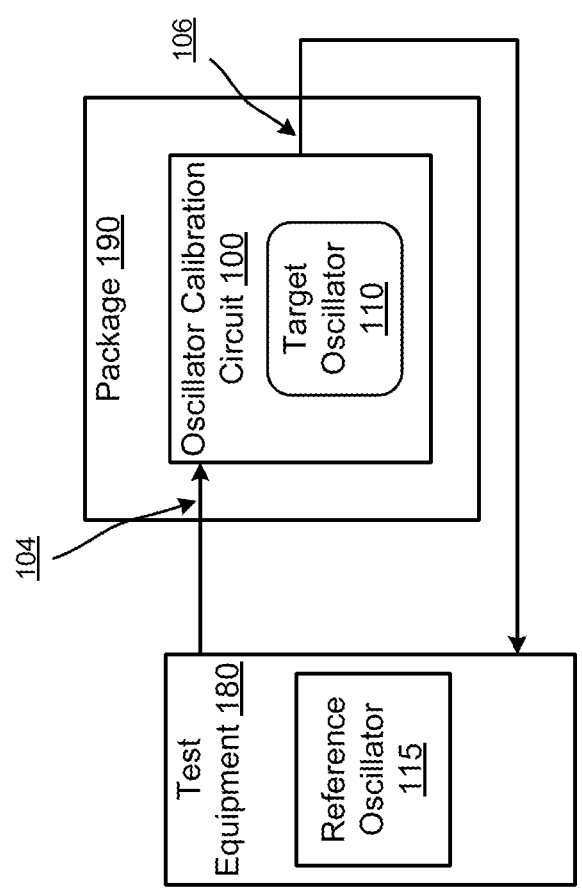
FIG. 1 is a block diagram that illustrates an oscillator calibration circuit, according to an embodiment.

FIG. 1 is a block diagram that illustrates an oscillator calibration circuit 100, according to an embodiment. As shown in FIG. 1, the oscillator calibration circuit 100 includes a target oscillator 110 configured to be calibrated against a reference oscillator 115 included in test equipment 180. Specifically, a frequency of a target oscillator signal produced by the target oscillator 110 is configured to be calibrated (e.g., calibrated by increasing, calibrated by decreasing) against a frequency of a reference oscillator signal produced by the reference oscillator 115. The target oscillator 110 can be referred to as a target oscillator because the oscillator is targeted for calibration. In some embodiments, the target oscillator signal can be referred to as a target clock signal, and the reference oscillator signal can be referred to as a reference clock signal. In some embodiments, an amplitude of the target oscillator signal and an amplitude of the reference oscillator signal can be the same or can be different.

In some embodiments, calibration of the frequency of the target oscillator signal can be referred to as being performed based on a calibration procedure (e.g., a calibration algorithm, an automatic calibration procedure, a self-trim calibration procedure). In some embodiments, the target oscillator 110 (and oscillator calibration circuit 100) can be associated with (e.g., included in) a device such as a microprocessor (e.g., a central processing unit), a set of transistors (e.g., flip-flops), an application-specific integrated circuit (ASIC), a digital signal processing (DSP) unit, a discrete component, a computing device (e.g., a portable computing device), telecom equipment, a circuit board, and/or so forth. In some embodiments, the calibration procedure can be performed during, for example, testing (e.g., wafer sort or final test, module test, and/or so forth) and/or operation of a device including the oscillator calibration circuit 100. In some embodiments, the reference oscillator 115, which is included in test equipment 180, can be coupled to the oscillator calibration circuit 100 during calibration of the target oscillator 110 during (or before) a test sequence. In some embodiments, the oscillator calibration circuit 100 can be any combination of digital circuitry (e.g., circuitry including metal-oxide-semiconductor field effect transistors (MOSFETs)) and analog circuitry (e.g., circuitry include bipolar junction transistors (BJTs)).

In this embodiment, the oscillator calibration circuit 100 includes an input terminal 104 (also can be referred to as an input pin) and an output terminal 106 (also can be referred to as an output pin). In some embodiments, the oscillator calibration circuit 100 can be configured with only two terminals—the input terminal 104 and the output terminal 106. Because the oscillator calibration circuit 100 includes a single input terminal 104 and a signal output terminal 106, one or more of the terminals can be used multiple times perform (e.g., trigger, facilitate) various types of functionality. Although shown with two terminals in FIG. 1, in some embodiments, the oscillator calibration circuit 100 can include a single terminal that can be used to perform (e.g., trigger, facilitate) various types of functionality related to calibration of the target oscillator 110 of the oscillator calibration circuit 100. In some embodiments, the oscillator calibration circuit 100 can have more than two terminals.

For example, a calibration procedure related to the target oscillator circuit 110 can be triggered by the test equipment 180 using a calibration start signal (e.g., a calibration initiation signal, a calibration enable signal) via the input terminal 104. A reference oscillator signal produced by the reference oscillator 115 can later be sent to the oscillator calibration circuit 100 via the input terminal 104. After calibration of a target oscillator signal produced by the target oscillator 110 has been completed, a status of the calibration procedure can be sent to the test equipment 180 via the output terminal 106. In some embodiments, the status can indicate a successful completion of at least a portion of a calibration of the target oscillator signal (e.g., a pass status) or a failure of at least a portion of the calibration of the target oscillator signal (e.g., a fail status).

The oscillator calibration circuit 100 can include a relatively small number of terminals (e.g., less than three terminals) so that other terminals of the package 190 can be used for other processing. Because calibration of the target oscillator 110 may be performed a relatively small number of times (e.g., once, twice), terminals of the package 190 related to operation of other circuits included in the package 190 can be reserved for (e.g., used for) functionality other than calibration of the target oscillator 110.

Some oscillator calibration circuits can have many terminals through which modes of the calibration circuits can be modified by external test equipment, information can be passed between the oscillator calibration circuit and the external test equipment, and/or so forth. To minimize (or reduce) the number of terminals of the oscillator calibration circuit 100, functionality that otherwise might be included in the test equipment 180 can be included in the oscillator calibration circuit 100. In this embodiment, the oscillator calibration circuit 100 can be configured to operate in a single calibration mode (rather than switching between modes) that is triggered by the test equipment 180. Specifically, the oscillator calibration circuit 100 can be configured to complete calibration in an autonomous (e.g., self-trimmed) fashion while in a single calibration mode without (or with relatively little) control via the test equipment 180. Information related to calibration of the target oscillator 110 as the calibration (e.g., calibration procedure) is performed may be processed (e.g., manipulated, maintained) within the oscillator calibration circuit 100, and completion of the calibration (either as a pass or fail) may be the next information communicated to the test equipment 180 after calibration has been initiated (via a calibration start signal).

As shown in FIG. 1, the oscillator calibration circuit 100 can be included in a package 190. In some embodiments, the package 190 can include more than two terminals (e.g., more than the two terminals coupled to the input terminal 104 and the output terminal 106 of the oscillator calibration circuit 100). In some embodiments, the package 190 can be a chip-scale package (CSP). Even though the package 190 can include more than two terminals, only two terminals (or less) may be dedicated to the two terminals of the oscillator calibration circuit 100.

In some embodiments, the package 190 can be a chip-scale package (CSP). In such embodiments, the oscillator calibration circuit 100 can be included in, or can be implemented as, a CSP device. In some embodiments, the chip-scale package device can be referred to as a chip-size packaging device. In some embodiments, the package 190, if a CSP device, can be less than or equal to 1.5 times the size of a semiconductor die including the oscillator calibration circuit 100. In some embodiments, the package 190, if a CSP device, can be greater than 1.5 times the size of the semiconductor die including the oscillator calibration circuit 100. In some embodiments, the package 190 can include pads or balls (e.g., a ball grid array (BGA)) that can be used to couple the oscillator calibration circuit 100 to, for example, at least a portion of the test equipment 180. In some embodiments, the oscillator calibration circuit 100 can be included in, or can be implemented as, as a wafer level chip scale package (WL-CSP).

In some embodiments, the target oscillator 110 can be a digitally controlled oscillator (DCO). In other words, the target oscillator 110 can be configured to receive a trim code (e.g., a trim code value), which can be digital bit values (e.g., binary bit values), that can be used to modify (e.g., increase, decrease) a frequency of the target oscillator signal produced by the target oscillator 110. In some embodiments, the trim code can be referred to as trim bit values or as frequency bit values. In some embodiments, the target oscillator 110 can include a network of resistors and/or capacitors that can be used (e.g., activated/deactivated via fuses, activated/deactivated via connections, and so forth) to define a frequency of the target oscillator signal based on the trim code. Specifically, the network of resistors and/or capacitors can have configurations (e.g., characteristics) that are modified based on the trim code so that the frequency of the target oscillator signal produced by the target oscillator 110 can be changed in a first direction (e.g., increased) or changed in a second direction (e.g., decreased).

In some embodiments, one or more components of the oscillator calibration circuit 100 can be integrated into a single, integrated component (with other components clocked by the target oscillator 110). In some embodiments, one or more components of the oscillator calibration circuit 100 can be packaged as a standalone discrete component (with other components clocked by the target oscillator 110). In some embodiments, the components of the oscillator calibration circuit 100 may not be integrated into a single component. In some embodiments, all, or nearly all, of the components of the oscillator calibration circuit 100 can be digitally-based components (rather than analog-based components).

Figure 2:
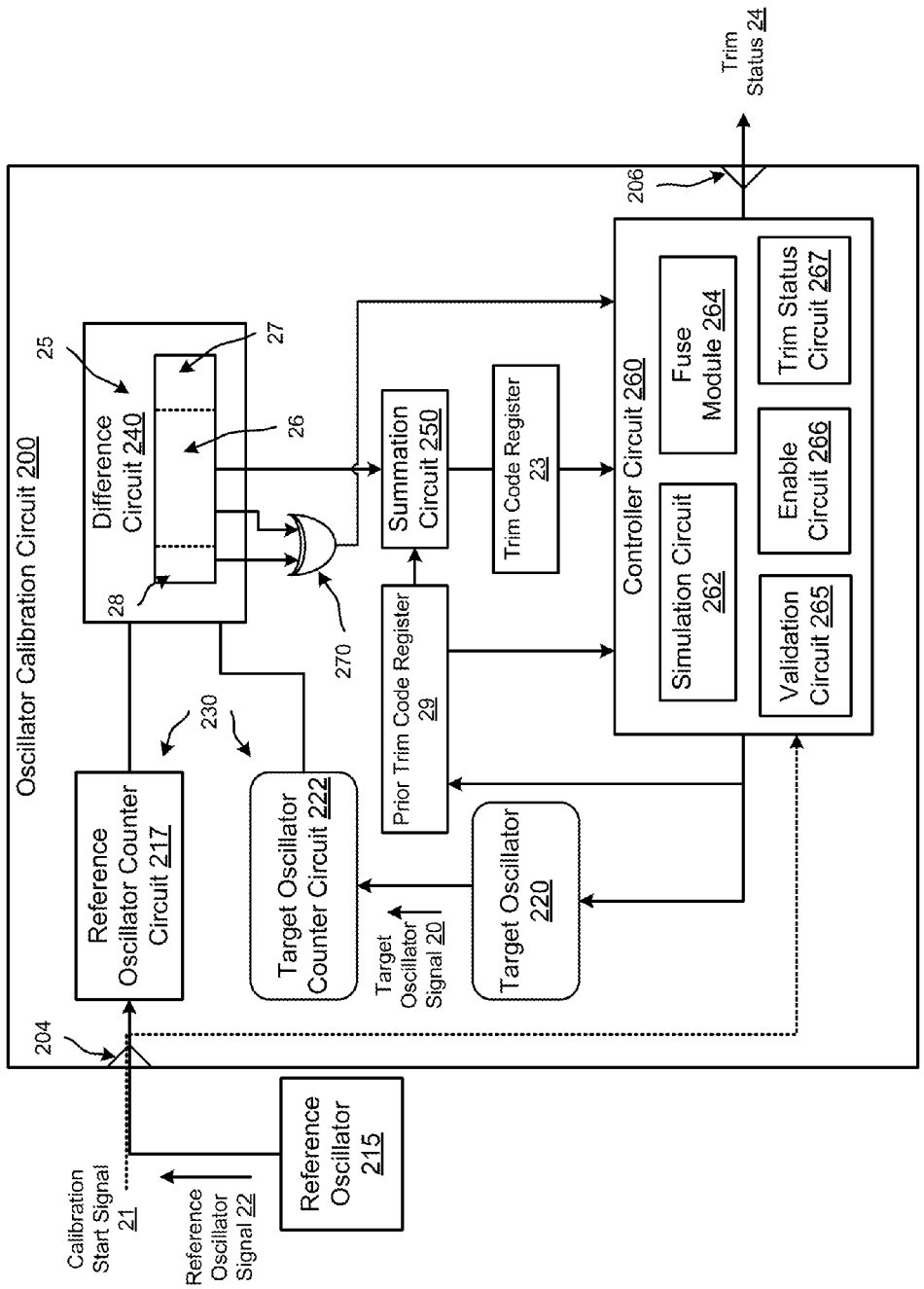
FIG. 2 is a block diagram that illustrates an implementation of an oscillator calibration circuit, according to an embodiment.

FIG. 2 is a block diagram that illustrates an implementation of an oscillator calibration circuit 200, according to an embodiment. The components of the oscillator calibration circuit 200 (e.g., counter circuits 230, difference circuit 240, summation circuit 250, and controller circuit 260) define a calibration loop configured to calibrate a frequency of a target oscillator signal 20 produced by a target oscillator 220 to a frequency of a reference oscillator signal 22 produced by a reference oscillator 215 based on count values during a calibration procedure. In other words, the components of the oscillator calibration circuit 200 can define a feedback loop that can be used (e.g., used during a calibration procedure) to calibrate the frequency of the target oscillator signal 20 to the frequency of the reference oscillator signal 22 based on count values. As shown in FIG. 2, reference oscillator signal 22 is received via an input terminal 204 of the oscillator calibration circuit 200.

Specifically, count values associated, respectively, with the reference oscillator signal 22 and the target oscillator signal 20 can be used to iteratively (e.g., recursively) produce a trim code, and updated trim codes, via the calibration loop during the calibration procedure. The trim code, and updates thereof, can be used to define (e.g., modify, iteratively define, increase, decrease) a frequency of the target oscillator signal 20 until the frequency of the target oscillator signal 20 is calibrated (e.g., calibrated within a specified threshold) to the reference oscillator signal 22. Once the trim code is at a value that calibrates the frequency of the target oscillator signal 20 to the reference oscillator signal 22, the trim code can be used to set (e.g., permanently set, permanently set via a fuse blow) the frequency of the target oscillator signal 20. In some embodiments, when the oscillator calibration circuit 200 has defined the trim code that sets the frequency of the target oscillator signal 20 within a frequency increment (e.g., within a trim code increment, within 1 least significant bit (LSB) of trim code), or within a threshold frequency, of the frequency of the reference oscillator signal 22, the frequency calibration can be referred to as having converged. In some embodiments, when the oscillator calibration circuit 200 has defined the trim code that sets the frequency of the target oscillator signal 20 to a frequency increment closest to the frequency of the reference oscillator signal 22, the frequency calibration can be referred to as having converged. In some embodiments, a trim code that is used to set the frequency of the target oscillator signal 20 (upon convergence) can be referred to as a final trim code.

In some embodiments, when the trim code toggles between two different trim codes (causing the frequency of the target oscillator signal 20 to toggle between frequencies within a frequency increment of the frequency of the reference oscillator signal 22), the frequency calibration can be considered as having converged. In other words, the frequency of the target oscillator signal 20 can be toggled between a frequency slightly below (and/or adjacent to) the frequency of the reference oscillator signal 22 and a frequency slightly above (and/or adjacent to) the frequency of the reference oscillator signal 22 in response to toggling between trim codes. In such instances, calibration of the frequency of the target oscillator signal 20 to the frequency of the reference oscillator signal 22 can be referred to as having converged. In some embodiments, the trim code that causes the frequency of the target oscillator signal 20 to be closest to the frequency of the reference oscillator signal 22 can be selected as a final trim code used to set the frequency of the target oscillator signal 20. In some embodiments, the oscillator calibration circuit 100 can be configured to converge within a few microseconds (e.g., 10 microseconds, 50 microseconds, 200 microseconds). In some embodiments, the convergence time can be less than a few microseconds (e.g., 10 nanoseconds) or greater than a few microseconds (e.g., 10 milliseconds, 100 milliseconds).

In some embodiments, a trim code can be defined (and simulated (e.g., simulated in a feedback loop)) during a first iteration of a calibration procedure, and then modified during subsequent iterations of the calibration procedure (and simulated (e.g., simulated in a feedback loop) during subsequent iterations of the calibration procedure) until the frequency of the target oscillator signal 20 is calibrated (based on the trim code) to the frequency of the reference oscillator signal 22. In some embodiments, the oscillator calibration circuit 200 (e.g., the calibration loop of the oscillator calibration circuit 200) can be configured to converge on a trim code within a few iterations of the calibration procedure (e.g., within 3 iterations of the calibration procedure, in less than 3 iterations of the calibration procedure, in more than 3 iterations of the calibration procedure). In some embodiments, the oscillator calibration circuit 200 can be configured to perform exactly a specified number of iterations, less than a specified number of iterations, or at least a specified number of iterations.

In this embodiment, the target oscillator signal 20 is calibrated to the reference oscillator signal 22 via a comparison of count values related, respectively, to each of these signals as determined by the counter circuits 230. The count values can represent relative frequencies of one or more signals. Specifically, a target oscillator counter circuit 222 from the counter circuits 230 is configured to count a number of cycles of the target oscillator signal 20 during a specified number of cycles counted by a reference oscillator counter circuit 217 from the counter circuits 230. The number of cycles counted by the target oscillator counter circuit 222 can be referred to as a target oscillator count value, and the number of cycles counted by the reference oscillator counter circuit 217 can be referred to as a reference oscillator count value.

For example, the reference oscillator counter circuit 217 can be configured to count a predetermined (e.g., a predefined) number of cycles (also can be referred to as a predetermined count value) of the reference oscillator signal 22 represented as a reference oscillator count value. During the counting performed by the reference oscillator counter circuit 217, the target oscillator counter circuit 222 can be configured to count a number of cycles of the target oscillator signal 20 represented as a target oscillator count value (until counting performed by the reference oscillator counter circuit 217 is completed). The relative number of cycles associated with the reference oscillator signal 22 and the target oscillator signal 20 can represent a relative frequency between the reference oscillator signal 22 and the target oscillator signal 20 (e.g., a relative frequency of the target oscillator signal 20 referenced to the reference oscillator signal 22). As a specific example the reference oscillator counter circuit 217 can be configured to count 2000 cycles of the reference oscillator signal 22. During the counting performed by the reference oscillator counter circuit 217, the target oscillator counter circuit 222 can count 1500 cycles of the target oscillator signal 20. Accordingly, the reference oscillator signal 22, in this example, is approximately 25% faster than the target oscillator signal 20.

In some embodiments, the reference oscillator counter circuit 217 and/or the target oscillator counter circuit 222 can be configured to count cycles related to signals for a specified period of time (rather than based on a predetermined number of cycles). In some embodiments, the target oscillator counter circuit 222 can be configured to count cycles of the target oscillator signal 20 to a predetermined number of cycles (also can be referred to as a predetermined count value), and the reference oscillator counter circuit 217 can be configured to count cycles of the reference oscillator signal 22 until counting performed by the target oscillator counter circuit 222 has been completed.

The difference circuit 240 is configured to produce a difference value stored in a difference register 25 based on the target oscillator count value and the reference oscillator count value. In some embodiments, the different circuit 240 can be configured to perform bitwise subtraction. In some embodiments, the difference value can represent a difference between the reference oscillator count value and the target oscillator count value. For example, if the reference oscillator count value is 2500 (e.g., 2500 cycles) and the target oscillator count value is 2000 (e.g., 2000 cycles), the difference circuit 240 can be configured to calculate the difference value to be 500 (e.g., 2500 cycles minus 2000 cycles=500 cycles).

As illustrated in FIG. 2, portions of difference values calculated and stored in a portion 26 of the difference register 25 by the difference circuit 240 can be used as a trim code (or as an updated version of the trim code) that is stored in a trim code register 23. In some embodiments, the portion 26 of the difference register 25 can be referred to as a trim code portion. Accordingly, portions of difference values calculated and stored in portion 27 and/or portion 28 may not be used, in some embodiments, to define a trim code stored in the trim code register 23. In some embodiments, the portion 27 can be referred to as a truncate portion or as a trim code multiplier, and the portion 28 can be referred to as an overflow portion. In some embodiments, the overflow portion 28 can be configured to store one or more bit values associated with the sign extended difference value. In some embodiments, the trim code portion 26 can correspond with a middle portion of bit values of a difference value stored in the difference register 25.

As a specific example, during a first iteration of a calibration procedure, a first difference value can be calculated based on a first target oscillator count value and a first reference oscillator count value. The difference value can be stored in the difference register 25. During the first iteration of the calibration procedure, a portion of the first difference value (e.g., a portion of the first difference value included in trim code portion 26 of the difference register 25) can be stored in the trim code register 23 as a trim code.

During a subsequent iteration of the calibration procedure, a second difference value can be calculated based on a second target oscillator count value and a second reference oscillator count value. The second difference value can be stored in the difference register 25. The trim code defined during the first iteration can be stored, during the second iteration, as a prior trim code in the prior trim code register 29. A portion of the second difference value (e.g., a portion of the second difference value included in trim code portion 26 of the difference register 25) can be combined with the prior trim code stored in the prior trim code register 29 using a summation circuit 250 to define an updated trim code stored in the trim code register 23. The updated trim code stored in the trim code register 23 can be further updated during subsequent iterations of the calibration procedure until the target oscillator signal 20 is calibrated to the reference oscillator signal 22 (or until a maximum or minimum trim code is calculated (e.g., reached)).

In some embodiments, during the first iteration of the calibration procedure described above, a portion of the first difference value stored in the trim code portion 26 of the difference register 25 can be combined to define the trim code stored in the trim code register 23 based on a value stored in the prior trim code register 29 using the summation circuit 250. In some embodiments, the summation circuit 250 can be configured to perform bitwise addition. Because the value stored in the prior trim code register 29 can be initialized to zero (because a prior trim code has not yet been defined), the trim code stored in the trim code register 23 using the summation circuit 250 can correspond with (e.g., can be identical to) the portion of the first difference value stored in the trim code portion 26 of the difference register 25. Although not shown in FIG. 2, in some embodiments, during the first iteration of the calibration procedure, a portion of the first difference value stored in the trim code portion 26 of the difference register 25 can bypass the summation circuit 250 and can be used to define a trim code stored in the trim code register 23.

In some embodiments, the trim code can be modified incrementally to a saturation point (e.g., up to a maximum value (without rolling over), down to a minimum value (without rolling over)). For example, if a trim code is a three bit value that defines a word, the trim code can represent numeric values 0 to 7 (which can correspond with 8 different frequency settings of the target oscillator signal 20) where 0 is associated with a minimum frequency setting (or change) of the target oscillator signal 20, and 7 can be associated with a maximum frequency setting (or change) of the target oscillator signal 20.

As shown in FIG. 2, the controller circuit 260 includes a simulation circuit 262. The simulation circuit 262 is configured to trigger the target oscillator 220 to operate based on a trim code (e.g., an updated trim code) stored at the trim code register 23 (without blowing fuses to permanently set a frequency of the target oscillator signal 20). For example, during a first iteration of a calibration procedure, a first trim code that is calculated based on a first difference value produced by the different circuit 240 can be stored in the trim code register 23. The first difference value can be calculated based on a first frequency (e.g., an initial frequency, a default frequency) of the target oscillator signal 20 and a frequency of the reference oscillator signal 22. The first trim code can be used to trigger a change (e.g., an increase, a decrease) in a frequency of the target oscillator signal 20 produced by the target oscillator 220 from the first frequency to a second frequency.

During a subsequent iteration of the calibration procedure, the first trim code can be stored in the prior trim code register 29 as a prior trim code. The first trim code can be updated to a second trim code based on a combination of a second difference value produced by the different circuit 240 and the prior trim code stored in the prior trim code register 29 using the summation circuit 250. The second difference value can be calculated by the difference circuit 240 based on the frequency of the reference oscillator signal 22 and the second frequency of the target oscillator signal 20 triggered based on the first trim code. The second trim code can be applied by the simulation circuit 262 to the target oscillator 220 to change the second frequency of the target oscillator signal 20 to a third frequency of the target oscillator signal 20.

In some embodiments, additional iterations of the calibration procedure can be performed until the target oscillator signal 20 is calibrated (e.g., calibrated within a threshold) to the reference oscillator signal 22. After calibration of the target oscillator signal 20 has been completed, a fuse module 264 of the controller circuit 260 can be configured to permanently set (e.g., permanently set via a fuse blow or another circuit network) a frequency of the target oscillator signal 20 to a calibrated frequency. Using the example above, if the third frequency of the target oscillator signal 20 (which is based on the second trim code) is calibrated to the frequency of the reference oscillator signal 22, the fuse module 264 can blow (or trigger blowing of) fuses associated with the target oscillator 220 based on the second trim code to set the frequency of the target oscillator signal 20 at the third frequency. In some embodiments, the frequency of the target oscillator signal 20 can be set at a frequency in response to a maximum or minimum trim code being calculated (e.g., reached), or exceeded.

As discussed above, in this embodiment, only a portion of a difference value included in the trim code portion 26 of the difference register 25 is used to define a trim code. In some embodiments, the portion of the difference value used to define the trim code can be based on a trim code accuracy (e.g., a target trim code accuracy, a specified trim code accuracy, a predefined trim code accuracy). Specifically, a predetermined number of cycles of the reference oscillator signal 22 counted by the reference oscillator counter circuit 217 during an iteration of the calibration procedure can be defined so that a difference value calculated at the difference circuit 240 can be truncated. A predetermined number of cycles of the reference oscillator signal 22 counted by the reference oscillator counter circuit 217 during an iteration of the calibration procedure can be defined so that a difference value calculated at the difference circuit 240 can be truncated without causing an undesirable decrease in accuracy (or to result in a specified accuracy). For example, a predetermined number of cycles to be counted during an iteration by the reference oscillator counter circuit 217 can be determined based on formula (1):

$$Count = RoundPower2\left(\sqrt{\frac{2}{TargetAccuracy}}\right) * \frac{1}{TargetAccuracy}, \quad (1)$$

where Count is a predetermined number of cycles to be counted by the reference oscillator counter circuit 217 during one or more iterations of the calibration procedure, and TargetAccuracy is a target trim code accuracy. The function "RoundPower2" is a function defined to round up a result to a nearest power of 2. In some embodiments, a term with a value greater than √(2/TargetAccuracy) can used in formula (1) and can be rounded up to the nearest power of 2. The following term (or variation thereof) from formula (1) (shown as formula (2)) can be used to calculate a factor for determining truncation to be applied by the difference circuit 240:

$$LSBcount = RoundPower2\left(\sqrt{\frac{2}{TargetAccuracy}}\right). \quad (2)$$

As a specific example, if a target trim code accuracy is defined (e.g., defined by a user) to be 1% (i.e., 0.01), formula (1) can be used to calculate Count=1600 (e.g., via Count=RoundPower2(14.14)*100). Formula (2) can be used to calculate LSBcount=16, which can be used to truncate a difference value calculated by the difference circuit 240. During a first iteration of a calibration procedure, a target oscillator count value of 1392 (associated with a 500 KHz) can be counted for a target oscillator signal 20 having a frequency of 500 kilohertz (kHz) by the target oscillator counter circuit 222. The target oscillator count value can be counted by the target oscillator counter circuit 222 during 1600 counts (which is the predetermined count value calculated based on formula (1)) of the reference oscillator signal 22 at a frequency of 575 kHz. A difference value of −208 can be calculated based on the difference between the target oscillator count value of 1392 and the reference oscillator count value of 1600. Truncation (e.g., truncation by division) of the difference value of −208 based on the LSBcount of 16 yields −13. If expressed in sign-extended binary values (which can be stored in difference register 25), the difference value of −208="111010000". Truncating (e.g., truncating bit values in the truncate portion 27) based on the LSBcount of 16 yields "11101". In some embodiments, approximately a 1% change in a frequency of the target oscillator signal 20 can be associated with a least significant bit (e.g., a single incremental change, a least significant bit) of a trim code.

As shown in FIG. 2, when calibration of the oscillator calibration circuit 200 has been completed, a trim status 24 can be produced and sent (e.g., sent to test equipment) via output terminal 206. The trim status 24 can represent a status related to a calibration procedure. In some embodiments, the trim status 24 can include one or more binary values (e.g., bit values) representing a status related to a calibration procedure. In some embodiments, the trim status 24 can indicate that blowing of fuses has been successfully completed or has failed, that convergence has been successfully completed or has failed, that a valid trim code has not been calculated, that a maximum or minimum trim code has been calculated (e.g., reached, exceeded) and/or so forth. In some embodiments, the trim status 24 can indicate that a calibration procedure has not yet started, the calibration procedure is currently being performed, and/or so forth. In some embodiments, the trim status 24 can be defined by a trim status circuit 267 included in the controller circuit 260.

As shown in FIG. 2, the controller circuit 260 includes a validation circuit 265. The validation circuit 265 can be configured to determine whether or not the target oscillator signal 20 produced by the target oscillator 220 and/or reference oscillator signal 22 produced by the reference oscillator 215 are valid (e.g., are active, have distinct cycles). For example, the validation circuit 265 can be configured to determine, during a calibration procedure, that the target oscillator signal 20 produced by the target oscillator 220 and/or reference oscillator signal 22 produced by the reference oscillator 215 are not valid. In such instances, calibration of the target oscillator signal 20 may not be performed and the calibration procedure can be terminated. In response to termination of the calibration procedure, the trim status 24 can indicate that calibration has been terminated, that a valid trim code was not calculated, that the target oscillator signal 20 and/or the reference oscillator signal 22 are not valid, and/or so forth. In some embodiments, a calibration procedure may be performed (or started) only when both the target oscillator signal 20 and the reference oscillator signal 22 are valid.

As shown in FIG. 2, the controller circuit 260 includes an enable circuit 266. The enable circuit 266 can be configured to enable (or disable) one or more portions of the oscillator calibration circuit 200 associated with the calibration procedure. For example, the enable circuit 266 can be configured to trigger the reference oscillator counter circuit 217 and/or the target oscillator counter circuit 222 to start counting cycles associated with, respectively, the reference oscillator signal 22 and/or the target oscillator signal 20. In some embodiments, the enable circuit 266 can be configured to synchronously trigger (or disable) the reference oscillator counter circuit 217 and the target oscillator counter circuit 222 to start counting cycles. In some embodiments, the enable circuit 266 can be configured to trigger a start of, or trigger a stop of, counting of cycles associated with each iteration of a calibration procedure by the reference oscillator counter circuit 217 and/or the target oscillator counter circuit 222. For example, the enable circuit 266 can be configured to trigger the reference oscillator circuit 217 to count a predetermined number of cycles of the reference oscillator signal 22 and can be configured to trigger the target oscillator counter circuit 222 to count cycles of the target oscillator signal 20 during counting of the cycles of the reference oscillator signal 22. In some embodiments, the enable circuit 266 can be configured to enable (or disable) other portions of the oscillator calibration circuit 200 such as operation of the target oscillator 220, the difference circuit 240, the summation circuit 250, and/or so forth. In some embodiments, the enable circuit 266 can be configured to trigger the reference oscillator circuit 217 to count cycles of the reference oscillator signal 22 and can be configured to trigger the target oscillator counter circuit 222 to count cycles of the target oscillator signal 20 during a specified period of time.

As shown in FIG. 2, the controller circuit 260 is configured to receive a calibration start signal 21 via the input terminal 204. In response to receiving the calibration start signal 21, the controller circuit 260 can be configured to trigger (e.g., trigger start of) a calibration procedure. In some embodiments, in response to receiving the calibration start signal 21, the enable circuit 266 of the controller circuit 260 can be configured to enable at least some portions of the oscillator calibration circuit 200. In some embodiments, the calibration start signal 21 can be received via the input terminal 204 before the reference oscillator signal 22 is received via the input terminal 204. Accordingly, the calibration start signal 21 in the reference oscillator signal 22 can be received during mutually exclusive time periods via the input terminal 204.

As shown in FIG. 2, an exclusive-or gate 270 is configured to produce an exclusive-or result based on at least one bit value from the overflow portion 28 (e.g., the most significant bit value) of the difference register 25 and based on at least one bit value from the trim code portion 26 (e.g., the most significant bit value) of the difference register 25. The exclusive-or result can indicate that a maximum trim code, or a minimum trim code, has been reached, or exceeded. In some embodiments, logic other than exclusive-or gate 270 can be used to indicate whether a maximum trim code, or a minimum trim code, has been reached, or exceeded. The controller circuit 260, in response to receiving the exclusive-or result, can be configured to trigger termination of a calibration procedure, trigger blowing fuses associated with the target oscillator 220, and/or so forth.

In some embodiments, the registers (e.g., the difference register 25, the prior trim code register 29, the trim code register 23) illustrated in FIG. 2 can be included in a single memory (or memory component) and/or in different components. In some embodiments, one or more of the components of the oscillator calibration circuit 200 can be combined or included in different circuits. For example, the summation circuit 250, or portions thereof, and/or the difference circuit 240, or portions thereof, can be included in the controller circuit 260. In some embodiments, the fuse module 264, the simulation circuit 262, and/or so forth may be included in circuit, or as a circuit, outside of the controller circuit 260.

An example of a calibration procedure that can be performed by the oscillator calibration circuit 200 (and/or the oscillator calibration circuit 100 shown in FIG. 1) is illustrated below:

```
prior_trim_code = 0;
first_pass = 1;
trim_code = 0;
while ((trim_code != prior_trim_code) || (first_pass == 1));
    prior_trim_code = trim_code;
    updated_trim_code = (reference_count − target_count) /
    (target_count / (100% / trim_code_accuracy));
    trim_code = prior_trim_code + updated_trim_code;
    first_pass = 0;
    If (trim_code > max_trim_code) then
        trim_code = max_trim_code;
        set error_flag;
        exit while loop.
```

In this example, a trim code (represented as "trim code") and a prior trim code (represented by "prior_trim_code") are initialized to zero. The while loop is iteratively performed to calculate the trim code, or an updated trim code (represented by "updated_trim_code"), until the trim code is equal to the prior trim code or until the trim code exceeds a maximum trim code (represented by "max_trim_code", which can be an absolute value of a maximum or minimum trim code). A reference oscillator count value is represented as "reference count", a target oscillator count value is represented by "target_count", and a target trim code accuracy is represented by "trim_code_accuracy".

Figure 3:
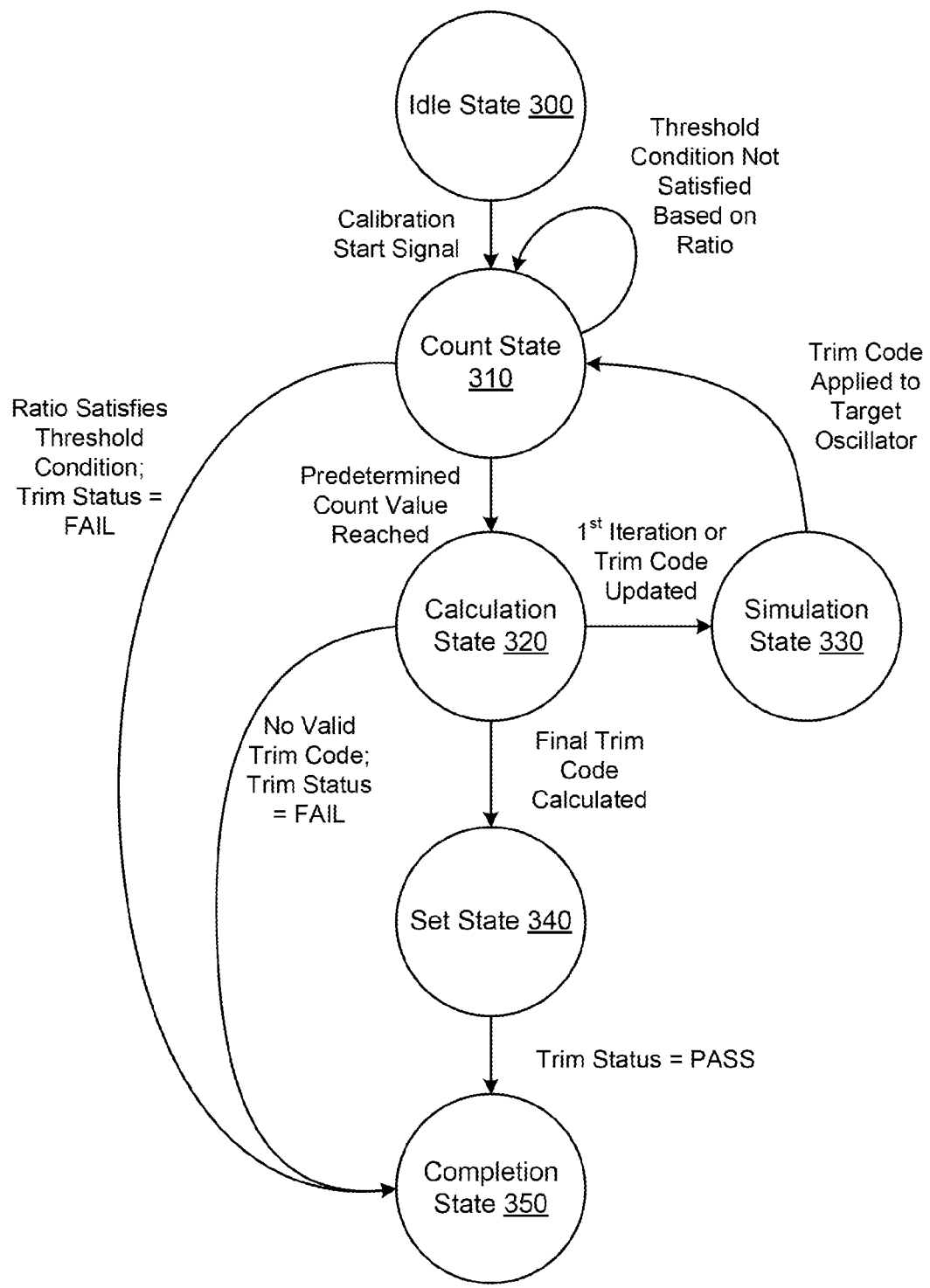
FIG. 3 is a state diagram that illustrates operation of an oscillator calibration circuit, according to an embodiment.

FIG. 3 is a state diagram that illustrates operation of an oscillator calibration circuit, according to an embodiment. In some embodiments, the state diagram illustrated in FIG. 3 can be implemented by the oscillator calibration circuit 100 shown in FIG. 1 and/or the oscillator calibration circuit 200 shown in FIG. 2.

As shown in FIG. 3, the oscillator calibration circuit starts in an idle state 300. In response to receiving a calibration start signal, the oscillator calibration circuit changes to a count state 310. When in the count state 310, the oscillator calibration circuit is configured to receive a reference oscillator signal from a reference oscillator (e.g., the reference oscillator signal 22 from the reference oscillator 215 shown in FIG. 2) and is configured to receive a target oscillator signal from a target oscillator (e.g., the target oscillator signal 20 from the target oscillator 220 shown in FIG. 2). While in the count state 310, the oscillator calibration circuit (or portions thereof) is configured to count cycles of the reference oscillator signal and cycles of the target oscillator signal.

As shown in FIG. 3, if a ratio (also can be referred to as a ratio value) of a reference oscillator count value to a target oscillator count value satisfies a threshold condition (e.g., is greater than the threshold value, is less than a threshold value), the oscillator calibration circuit is changed to a completion state. When the ratio satisfies a threshold condition (e.g., is greater than 3:1), an indicator that calibration has failed can be defined as a trim status. The calibration can be a failure because the threshold condition, when satisfied based on the ratio, can represent that a difference between the reference oscillator count value and the target oscillator count value can be too large for correction (or has reached a maximum possible correction). For example, if a ratio of a reference oscillator count value to a target oscillator count value is less than 2:3 or greater than 4:3, the oscillator calibration circuit can be changed to a completion state 350. In some embodiments, in response to the threshold condition being satisfied, a maximum trim code or a minimum trim code can be applied to a target oscillator. In some embodiments, a ratio value can be based on a magnitude of an adjustment (e.g., correction) that can be implemented using a maximum trim code or a minimum trim code. For example, if a maximum trim code can adjust for only a 25% difference between a target oscillator count value and a reference oscillator count value, the ratio (which can function as a threshold ratio triggering completion) can be based on the 25% difference. As shown in FIG. 3, when the threshold condition is not satisfied based on the ratio, the oscillator calibration circuit can remain in the count state 310.

In some embodiments, the ratio can be calculated based on a specified number of cycles (and/or within a specified time period), which can be referred to as a ratio count value. In some embodiments, the ratio count value can be equal to or a fraction of the number of cycles associated with a predetermined count value. For example, the oscillator calibration circuit can be configured to count cycles associated with a reference oscillator signal up to a predetermined count value of, for example, 1600. In such embodiments, the ratio count value can be, for example, 12. In some embodiments, the ratio count value can be a relatively low number compared with the predetermined count value so a calibration procedure performed by the oscillator calibration circuit can be terminated relatively early within the calibration procedure if correction of the target oscillator may not be achieved in a desirable fashion (as determined based on the ratio). In some embodiments, the ratio can be calculated based on cycles counted within a specified time period.

As shown in FIG. 3, in response to the predetermined count value being reached, the oscillator calibration circuit is configured to change to a calculation state 320. When in the calculation state 320, the oscillator calibration circuit is configured to calculate a trim code (or updated trim code). If the iteration is a first iteration or if the trim code has been updated, the oscillator calibration circuit is configured to change to a simulation state 330 where the trim code (which can be updated) is applied to the target oscillator. After the trim code has been applied to the target oscillator, the oscillator calibration circuit returns to the count state 310.

As illustrated in FIG. 3, the calibration procedure is iteratively (e.g., recursively) performed within the count state 310, the calculation state 320, and the simulation state 330, until a final trim code is calculated (e.g., until the trim code is no longer updated, until the trim code toggles between two trims codes where one is selected as the final trim code) or until a valid trim code is not found. In some embodiments, the final trim code can be calculated in response to the trim code (e.g., calculated during the calculation state 320) not changing (e.g., not being updated, remaining at the same value) for more than a specified number of times (e.g., not changing two times). In some embodiments, the final trim code can be calculated in response to the trim code toggling between two different values.

In scenarios where the final trim code is calculated (and is valid (e.g., does not exceed a maximum trim code or a minimum trim code)), the oscillator calibration circuit is configured to change to a set state 340. When in the set state 340, the final trim code is applied to (e.g., permanently applied to, the non-reversibly applied to) the target oscillator to set the frequency of the target oscillator signal produced by the target oscillator. In some embodiments, the frequency of the target oscillator signal can be set at a frequency that is calibrated to a frequency of the reference oscillator signal based on the final trim code. As shown in FIG. 3, after processing in the set state 340 has been completed, the trim status can indicate successful completion of calibration of the target oscillator.

If a valid trim code is not calculated, the oscillator calibration circuit is changed to the completion state 350. A valid trim code may not be calculated, in some embodiments, where a difference between the frequency of the reference oscillator signal and the frequency of the target oscillator signal is too large to be adjusted in a desirable fashion by a trim code. In such embodiments, the trim code may exceed a maximum trim code or a minimum trim code (and will be invalid), and a maximum trim code or a minimum trim code may be applied to the target oscillator (while the oscillator calibration circuit is in a set state (e.g., set state 340)). In such embodiments, calibration of the target oscillator can be indicated as having failed via a trim status.

Figure 4:
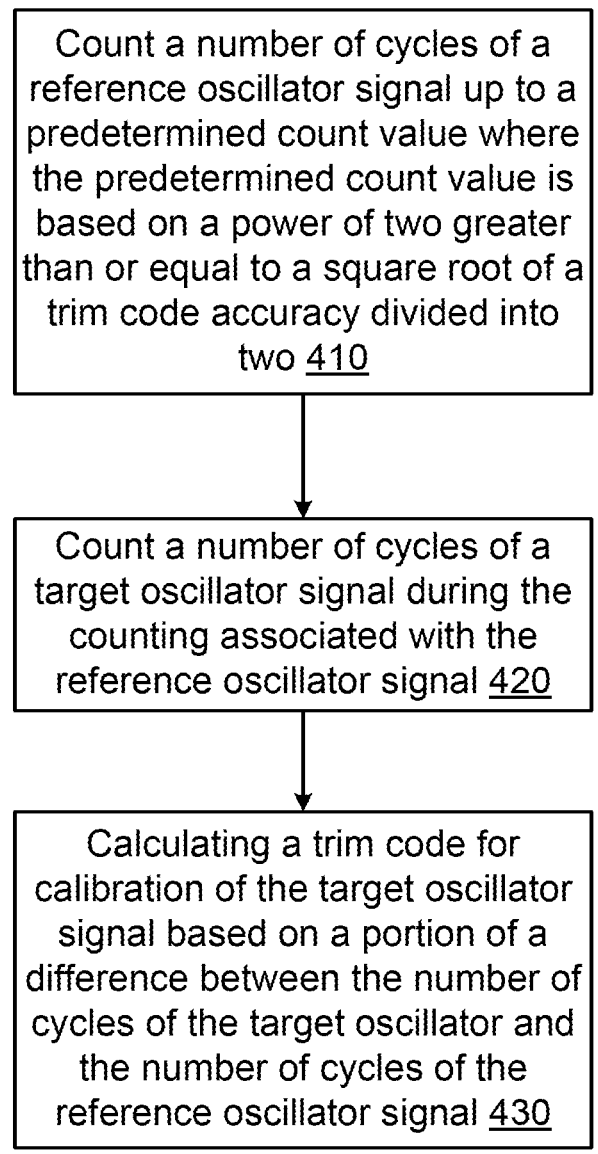
FIG. 4 is a diagram that illustrates a method for calibrating a target oscillator signal, according to embodiment.

FIG. 4 is a diagram that illustrates a method for calibrating a target oscillator signal, according to an embodiment. In some embodiments, at least some portions of the method can be performed by the oscillator calibration circuit 100 shown in FIG. 1 and/or the oscillator calibration circuit 200 shown in FIG. 2.

A number of cycles of a reference oscillator signal is counted up to a predetermined count value where the predetermined count value is based on a power of two greater than or equal to a square root of a trim code accuracy divided into two (block 410). In some embodiments, the cycles of the reference oscillator signal can be counted by the reference oscillator counter circuit 217 shown in FIG. 2. In some embodiments, the reference oscillator signal can be produced by reference oscillator 215 shown in FIG. 2.

A number of cycles of a target oscillator signal is counted during the counting associated with the reference oscillator signal (block 420). In other words, the number of cycles of the target oscillator signal is counted concurrently with counting associated with reference oscillator signal. In some embodiments, the cycles of the target oscillator signal can be counted by the target oscillator counter circuit 222 shown in FIG. 2. In some embodiments, the target oscillator signal can be produced by the target oscillator 220 shown in FIG. 2. In some embodiments, counting associated with reference oscillator signal and counting associated with the target oscillator signal can be triggered by a calibration start signal received via an input terminal through which the reference oscillator signal is also received.

A trim code for calibration of the target oscillator signal is calculated based on a portion of a difference between the number of cycles of the target oscillator and the number of cycles of the reference oscillator signal (block 430). In some embodiments, the difference can be calculated using the difference circuit 240 shown in FIG. 2. In some embodiments, the trim code can be calculated based on a prior trim code. In some embodiments, the portion can be bit values from a middle portion of the difference.

Figure 5:
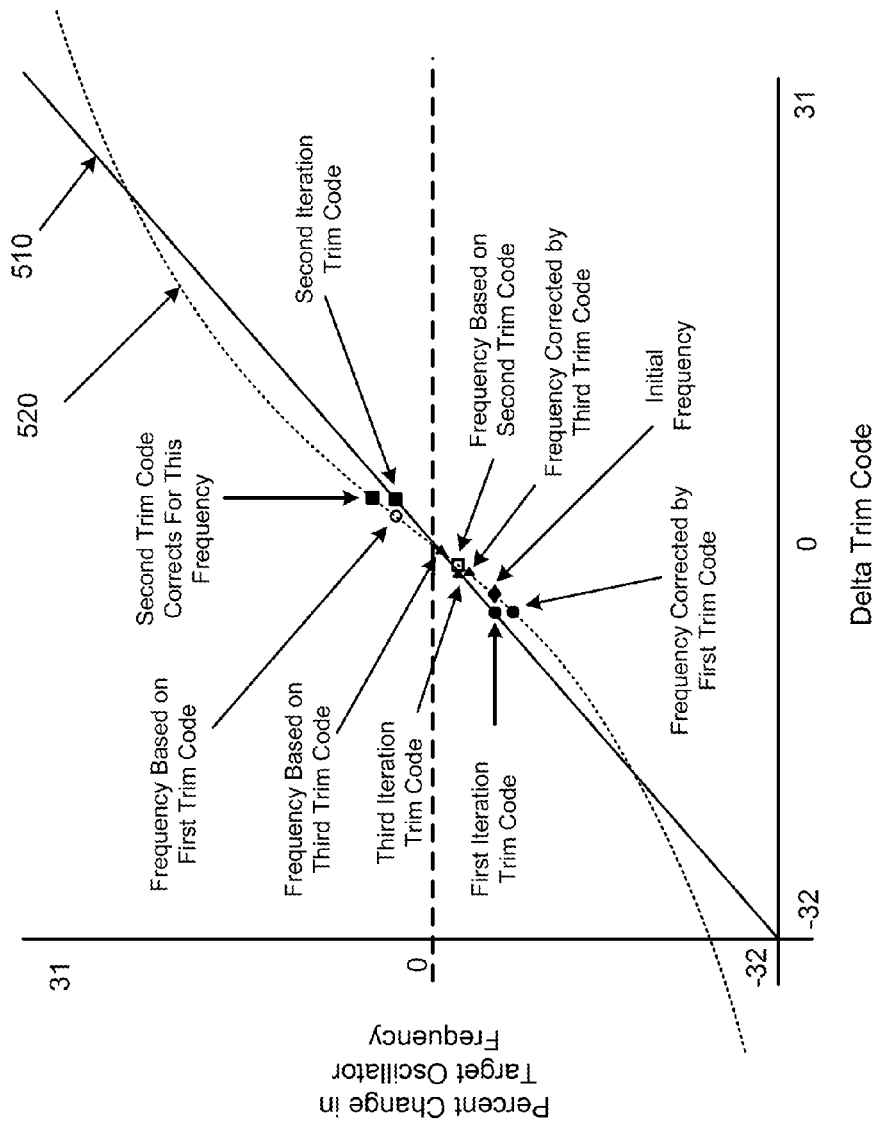
FIG. 5 is a diagram that graphically illustrates calibration of a target oscillator signal, according to an embodiment.

FIG. 5 is a diagram that graphically illustrates calibration of a target oscillator signal, according to an embodiment. In some embodiments, at least some portions of the calibration can be performed by the oscillator calibration circuit 100 shown in FIG. 1 and/or the oscillator calibration circuit 200 shown in FIG. 2.

In this embodiment, a percent change in frequency of the target oscillator signal is shown on the y-axis, and a delta trim code is illustrated on the x-axis. In this embodiment, the percent change in the frequency of the target oscillator signal can vary between 31% and −32%, and the trim code can change between 31 and −32. An incremental, or whole number, change in the trim code is assumed to correspond with a 1% change in the frequency of the target oscillator signal. In this embodiment, the frequency of the reference oscillator signal to which the target oscillator signal is being calibrated is at coordinates (0,0).

In this embodiment, a linear correlation between the percentage change in the frequency of the target oscillator signal and changes in the trim code is assumed as illustrated by line 510. An actual effect of the trim code change on the frequency the target oscillator signal is illustrated as dashed line 520, which is nonlinear. In this embodiment, the oscillator calibration circuit design may have a "near-linear" trim adjustment slope, such that at any given frequency starting point of the target calibration signal (e.g., initial frequency of the target calibration circuit), a calculated frequency adjustment with a trim code may change the initial frequency of the target oscillator signal closer to the reference oscillator signal frequency. With each iteration within the calibration procedure, the resulting generated trim code can cause the frequency of the target oscillator signal to be closer than the previous iteration until the frequency of the target oscillator signal is within an increment (e.g., 1%) of the reference oscillator signal frequency (or until the maximum trim code has been used and the adjustment needed would be outside the maximum trim code).

An initial frequency of the target oscillator signal is illustrated by a diamond on line 520. In response to a difference value calculated based on the initial frequency of the target oscillator signal and a frequency of the reference oscillator signal during a first iteration, a trim code is calculated as illustrated by a circle on line 510. The trim code calculated during the first iteration can be referred to as a first trim code. The first trim code corrects for the frequency illustrated by the circle on line 520. When applied (during simulation), the first trim code causes the frequency illustrated by an open circle on line 520.

In response to a difference value calculated based on the frequency of the target oscillator signal based on the first trim code and the frequency of the reference oscillator signal during a second iteration, a trim code is calculated as illustrated by a square on line 510. The trim code calculated during the second iteration can be referred to as a second trim code. The second trim code corrects for the frequency illustrated by the square on line 520. When applied (during simulation), the second trim code causes the frequency illustrated by an open square on line 520.

In response to a difference value calculated based on the frequency of the target oscillator signal based on the second trim code and the frequency of the reference oscillator signal during a third iteration, a trim code is calculated as illustrated by a triangle on line 510. The trim code calculated during the third iteration can be referred to as a third trim code. The third trim code corrects for the frequency illustrated by the triangle on line 520. When applied (during simulation), the third trim code causes the frequency illustrated by an open triangle on line 520.

In this embodiment, the frequency caused by the third trim code can be within a threshold value of the frequency of the reference oscillator signal. Accordingly, the third trim code can be designated as the final trim code. The final trim code can be used to set the frequency of the target oscillator signal.

In some embodiments, an oscillator calibration circuit can be configured to set the frequency of the target oscillator signal at a frequency within at least one frequency increment of the reference oscillator signal after a calibration time period has expired, after a specified number of iterations have been performed, and/or so forth. In such embodiments, the frequency of the target oscillator signal may not be set at the closest of two frequency increments to the reference oscillator signal, but may still be set at a frequency that is within one frequency increment of the frequency of the reference oscillator signal. This situation can arise when the frequency of the target oscillator signal is bouncing (e.g., toggling) between a first frequency increment and a second frequency increment around the reference oscillator signal where the first frequency increment is closer to the reference oscillator signal (in frequency value) than the second frequency increment. If the calibration time period expires, the number of iterations have been completed, and/or so forth, when the frequency bit values are triggering the target oscillator signal to be at the second frequency increment, the target oscillator signal can be set at the second frequency increment (which is farther from the reference oscillator signal than the first frequency increment but is still within a frequency increment of the reference oscillator signal).

Implementations of the various techniques described herein may be implemented in digital electronic circuitry, or in computer hardware, firmware, software, or in combinations of them. Some implementations may be implemented using various semiconductor processing and/or packaging techniques. As discussed above, some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
 a reference oscillator counter circuit configured to produce a reference oscillator count value based on a reference oscillator signal;
 a target oscillator counter circuit configured to produce a target oscillator count value based on a target oscillator signal, the target oscillator signal having a frequency targeted for calibration against a frequency of the reference oscillator signal;
 a difference circuit configured to calculate a difference between the reference oscillator counter value and the target oscillator counter value; and
 a summation circuit configured to define a trim code based on only a portion of bit values from the difference.

2. The apparatus of claim 1, further comprising:
 a summation circuit configured to define the trim code based on a combination of a prior trim code and the portion of the difference.

3. The apparatus of claim 1, wherein the trim code is defined based on bit values from a middle portion of the difference.

4. The apparatus of claim 1, wherein the reference oscillator counter circuit is configured to produce the reference oscillator count value based on counting cycles of the reference oscillator signal to a predetermined count value,
 the apparatus further comprising:
 a controller circuit configured to calculate, before the predetermined count value has been reached by the reference oscillator counter circuit, a ratio of a number of cycles of the reference oscillator signal to a number of cycles of the target oscillator signal.

5. The apparatus of claim 1, further comprising:
 a controller circuit configured to calculate a ratio of a number of cycles of the reference oscillator signal to a number of cycles of the target oscillator signal, the controller circuit configured to trigger termination of calibration when the ratio is greater than a threshold representing a maximum adjustment implementable by the trim code.

6. The apparatus of claim 1, wherein the reference oscillator count value is a predetermined count value defined based on a power of two greater than or equal to a square root of a trim code accuracy divided into two.

7. The apparatus of claim 1, further comprising:
 a circuit configured to trigger a controller circuit to terminate calibration of the frequency of the target oscillator signal against the reference oscillator signal based on an exclusive-or combination of a most significant bit of the difference and at least a portion of a middle portion of the bit values from the difference.

8. The apparatus of claim 1, further comprising:
 a controller circuit configured to trigger iteratively update the trim code until the trim code is unchanged or is toggled between two different values.

9. A method, comprising:
 counting a number of cycles of a reference oscillator signal up to a predetermined count value, the predetermined count value being based on a power of two greater than or equal to a square root of a trim code accuracy divided into two;

counting a number of cycles of a target oscillator signal during the counting associated with the reference oscillator signal; and calculating a trim code for calibration of the target oscillator signal based on a portion of a difference between the number of cycles of the target oscillator and the number of cycles of the reference oscillator signal.

10. The method of claim 9, wherein the predetermined count value is based on a value rounded up to a nearest power of two.

11. The method of claim 9, wherein the counting associated with the reference oscillator, the counting associated with the target oscillator and the calculating are performed during a first calibration iteration, wherein the trim code is a first trim code, the difference is first difference;

modifying a frequency of the target oscillator signal based on the first trim code;

calculating a second difference during a second calibration iteration based on the modified frequency of the target oscillator signal;

designating the first trim code as a prior trim code during the second calibration iteration; and calculating a second trim code based on a combination of the prior trim code and a portion of the second difference.

12. The method of claim 9, further comprising:

sending a pass trim code status when the trim code is unchanged or is toggled between two different values.

13. The method of claim 9, wherein the calculating of the trim code includes adding the difference to a prior trim code value after removing at least three bit values.

14. The method of claim 9, wherein the counting associated with the reference oscillator signal, the counting associated with the target oscillator signal, and the calculating the trim code are iteratively performed during a calibration procedure, the method further comprising:

terminating the calibration procedure after a specified number of iterations.

15. The method of claim 9, wherein the trim code is calculated based on a linear trim code relationship, and the trim has a non-linear effect on the target oscillator signal.

16. An apparatus, comprising:

a target oscillator calibration circuit including a target oscillator configured to produce a target oscillator signal;

an input terminal coupled to the target oscillator calibration circuit, the input terminal configured to receive an enable signal configured to trigger operation of the target oscillator calibration circuit at a first time and configured to receive, at a second time after the first time, a reference oscillator signal for calibrating the target oscillator signal; and an output terminal coupled to the target oscillator calibration circuit and configured to receive an indicator of a trim status at a third time after calibration of the target oscillator signal has been completed.

17. The apparatus of claim 16, wherein the input terminal is the only input terminal coupled to the target oscillator calibration circuit.

18. The apparatus of claim 16, wherein the output terminal is the only output terminal coupled to the target oscillator calibration circuit.

19. The apparatus of claim 16, wherein the input terminal, the output terminal, and the target oscillator calibration circuit are integrated into a chip scale package.

20. The apparatus of claim 16, wherein the calibration of the target oscillator signal is performed based on an iterative calibration procedure during a single calibration mode.

\* \* \* \* \*